US006782016B2

(12) United States Patent
Braiman et al.

(10) Patent No.: US 6,782,016 B2
(45) Date of Patent: Aug. 24, 2004

(54) MASTER LASER INJECTION OF BROAD AREA LASERS

(75) Inventors: Yehuda Y. Braiman, Oak Ridge, TN (US); Yun Liu, Oak Ridge, TN (US)

(73) Assignee: UT-Battelle, L.L.C., Oak Ridge, TN (US)

( * ) Notice: Subject to any disclaimer, the term of this patent is extended or adjusted under 35 U.S.C. 154(b) by 0 days.

(21) Appl. No.: 09/999,187

(22) Filed: Nov. 30, 2001

(65) Prior Publication Data

US 2003/0103534 A1 Jun. 5, 2003

(51) Int. Cl.[7] .................................................. H01S 3/10
(52) U.S. Cl. .............................. 372/26; 372/9; 372/10; 372/28; 372/29.02; 372/32
(58) Field of Search ............................ 372/9, 10, 26, 372/28, 29.02, 32, 29.01

(56) References Cited

U.S. PATENT DOCUMENTS

| | | | | |
|---|---|---|---|---|
| 4,757,268 A | * | 7/1988 | Abrams et al. ............... | 330/4.3 |
| 4,831,333 A | * | 5/1989 | Welch .......................... | 349/195 |
| 4,972,427 A | * | 11/1990 | Streifer et al. ................. | 372/92 |
| 5,105,428 A | * | 4/1992 | Pocholle et al. .............. | 372/24 |
| 5,121,400 A | * | 6/1992 | Verdiell et al. ............... | 372/32 |
| 5,305,334 A | * | 4/1994 | Margalit et al. .............. | 372/32 |
| 5,430,748 A | * | 7/1995 | MacCormack et al. | 372/29.016 |
| 6,181,463 B1 | * | 1/2001 | Galvanauskas et al. ..... | 359/330 |
| 6,219,360 B1 | * | 4/2001 | Komine .......................... | 372/9 |

OTHER PUBLICATIONS

Apollonov et al., "Phase–locking of a linear array of high–power laser diodes," Quantum Electronics, 29(10):839–841, 1999.
Bartelt–Berger et al., "Power–scalable system of phase–locked single–mode diode lasers," Applied Optics, 38(27): 5752–5760, 1999.
Horiuchi et al., "Narrow bandwidth operation of high–power broad–area diode laser using cascaded phase–conjugate injection locking," Appl. Phys. B, 68:1021–1025, 1999.

* cited by examiner

Primary Examiner—Tan Ho
Assistant Examiner—Leith Al-Nazer
(74) Attorney, Agent, or Firm—Gray Cary Ware & Freidenrich LLP (57) ABSTRACT

Systems and methods are described for laser array synchronization using master laser injection of broad area lasers. A method, includes: master laser injecting a plurality of broad area lasers; and externally cavity coupling the plurality of broad area lasers. A method, includes: master laser injecting a plurality of broad area lasers; and externally Q switch coupling the plurality of broad area lasers. A method, includes: injection synchronizing a plurality of pulsed broad area lasers using a signal source; modulating the plurality of pulsed broad area lasers using the signal source; and externally coupling the plurality of pulsed broad area lasers.

36 Claims, 10 Drawing Sheets

Interference Patterns

After Synchronization

FIG. 3A

Before Synchronization

MASTER LASER INJECTION OF BROAD AREA LASERS

BACKGROUND OF THE INVENTION

1. Field of the Invention

The invention relates generally to the field of lasers. More particularly, the invention laser array synchronization. Specifically, a preferred implementation of the invention relates to a high intensity, synchronized laser array.

2. Discussion of the Related Art

Laser sources have been widely adopted in various applications, including optical space communications, materials processing, and military applications. In some of these applications, a high intensity, high power laser source may be desirable.

Limitations of laser output power are often related to cavity size and material. While a single laser with a large emission area (broad area laser) can in general provide high output power, it can also present higher order transverse modes, which deteriorate beam quality and are not suitable in many situations.

One approach to solving the above-discussed problems of providing high power and avoiding higher order transverse modes involves utilizing a laser array. Such arrays integrate a number of lasers to provide a larger amount of power. However, a disadvantage of this approach is that the uncorrelated phase relationship between individual lasers largely limits the coherence and, accordingly, the achievable output intensity of the array.

Therefore, what is needed is a solution that provides injection, frequency and phase synchronization of a laser array, in order to provide a coherent laser array source. Furthermore, what is also needed is a solution that provides scalable laser source synchronization, allowing simultaneous synchronization of multiple continuous wave lasers and/or multiple pulsed lasers, assembled in an array or assembled separately.

Heretofore, the requirement of providing scalable frequency and phase synchronization of an array of laser sources has not been fully met. What is needed is a solution that addresses this requirement.

SUMMARY OF THE INVENTION

There is a need for the following embodiments. Of course, the invention is not limited to these embodiments.

According to an aspect of the invention, a method comprises: master laser injecting a plurality of broad area lasers; and externally cavity coupling the plurality of broad area lasers. According to another aspect of the invention, a method comprises: master laser injecting a plurality of lasers; and Q switch coupling the plurality of lasers. According to another aspect of the invention, a method comprises: injection synchronizing a plurality of pulsed lasers using a signal source; modulating the plurality of pulsed lasers using the signal source; and externally coupling the plurality of pulsed lasers.

According to another aspect of the invention, an apparatus comprises: a plurality of broad area lasers; a master injection laser coupled to each of the plurality of broad area lasers; and external cavity coupling optics coupled to each of the plurality of broad area lasers. According to another aspect of the invention, an apparatus comprises: a plurality of lasers; a master injection laser coupled to each of the plurality of lasers; and Q switch circuitry coupled to each of the plurality of lasers.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Citations for several publications may be found at the end of the specification immediately preceding the claims after the section heading References. The disclosures of all these publications in their entireties are hereby expressly incorporated by reference herein for the purpose of indicating the background of the invention and illustrating the state of the art.

In general, the context of the invention can include synchronization of lasers. The context of the invention can include laser array synchronization. The context of the invention can include a high intensity, synchronized broad area laser array. The context of the invention can also include a pulsed laser array The invention can include synchronizing a variety of lasers, including: semiconductor lasers, solid state lasers, fiber lasers, and gas lasers. A wide variety of lasers can be utilized in conjunction with the invention. The invention can include synchronization of lasers assembled in an array or configured separately. The invention can includes synchronization of s via optical injection and external cavity coupling. The invention can also include synchronization of pulsed Nd:YAG lasers via optical injection and possible external cavity coupling Synchronization of lasers in an array can provide a high-intensity, high power coherent light source. The invention can include synchronization via optical injection and external coupling. The invention can also include phase coupling. In-phase coupling of a light output from the laser array can provide significant improvements in light output power and beam quality (beam divergence and size).

The invention can provide frequency and phase synchronization of a laser array, including both continuous wave (CW) laser arrays and pulsed arrays. The invention can include: (i) synchronizing all laser components of an array in order to form a coherent laser array by utilizing a scalable injection method and/or apparatus to simultaneously injection synchronize multiple continuous wave or pulsed lasers; (ii) utilizing an external optical coupling method and/or apparatus to enhance the coherence of the laser array, optional, at a condition of high power operation; and (iii) in phase-coupling a light output from the array, which can in-turn optically provide an N-square effect.

By definition, the total output power ($P_{tot}$) of an array increases proportionally to the number of lasers (N) forming the array, that is: $P_{tot} \propto N.P_o$, where $P_o$ denotes the output power of each array element including dissipative losses. Nevertheless, the total output intensity ($I_{tot}$, power per unit area, i.e., $I_{tot}=P_{tot}/S_{tot}$, where $S_{tot}$ is the area of the diffraction limited beam size on the focused plane) depends on the degree of coherence among lasers. If emissions from the lasers are not coherent, the beam intensity produced by the array scales as: $I_{tot} \propto N.I_o$, where $I_o$ is the beam intensity of a single laser.

However, if emissions from all lasers are in phase, the diffraction limited beam size is reduced as an inverse function of N, that is: $Stot^4$ So/N, where So is the beam size obtained in the case of a single laser. Such effect is referred to as the N-square effect, and the total output intensity of the laser array may be written as: $Itot^4$ N2.Io As noted above, the invention can include a method and/or apparatus for providing phase locking. In order for a more synchronized behavior to be obtained, all the array elements may be coupled together and phase locked, providing a controlled dynamic stability. The invention can also include a nearest neighbor coupling technique and/or a global coupling technique. In order to achieve phase locking, couplings among diode laser emitters can be utilized. In a specific embodiment, coupling may be used to phase lock broad stripe laser arrays.

As noted above, the invention can include a method and/or apparatus for providing injection locking. Injection locking can be utilized to control the laser array spectrum and far-field pattern. With a successful injection locking, a slave laser can follow the frequency and linewidth of a master injection laser, and also its temporal responses. The loss modulation can drive lasers into a pulsing regime. Moreover, the power concentrated in such pulses can be much higher than in a continuous wave mode.

The invention can include shining an external beam from a master single frequency laser to the facet of a slave laser or to the facets of multiple slave lasers. The incident angle can be adjusted to stimulate a specific mode, which can yield a high, coherent output power. The invention can include feeding back a part of an output beam through a grating, an etalon or a phase conjugated mirror. A maximum injection effect can be achieved via individually controlled mode-matching. Individually controlled phase modulation can provide a fine-tuning of the injections.

The invention can provide an uniform and controlled optical injection (injection locking) into each laser of a laser array, while allowing a large separation between each laser. The invention can provide a method and/or apparatus to synchronize continuous wave laser arrays and pulsed laser arrays. Coupling between lasers can be achieved by re-injecting a portion of the emitted light back into the cavities of the lasers (external cavity coupling). Utilization of both optical injection and external cavity coupling can provide a coherent, high-power, single mode operation of the laser array, therefore improving the output intensity of the array.

Figure 1A:
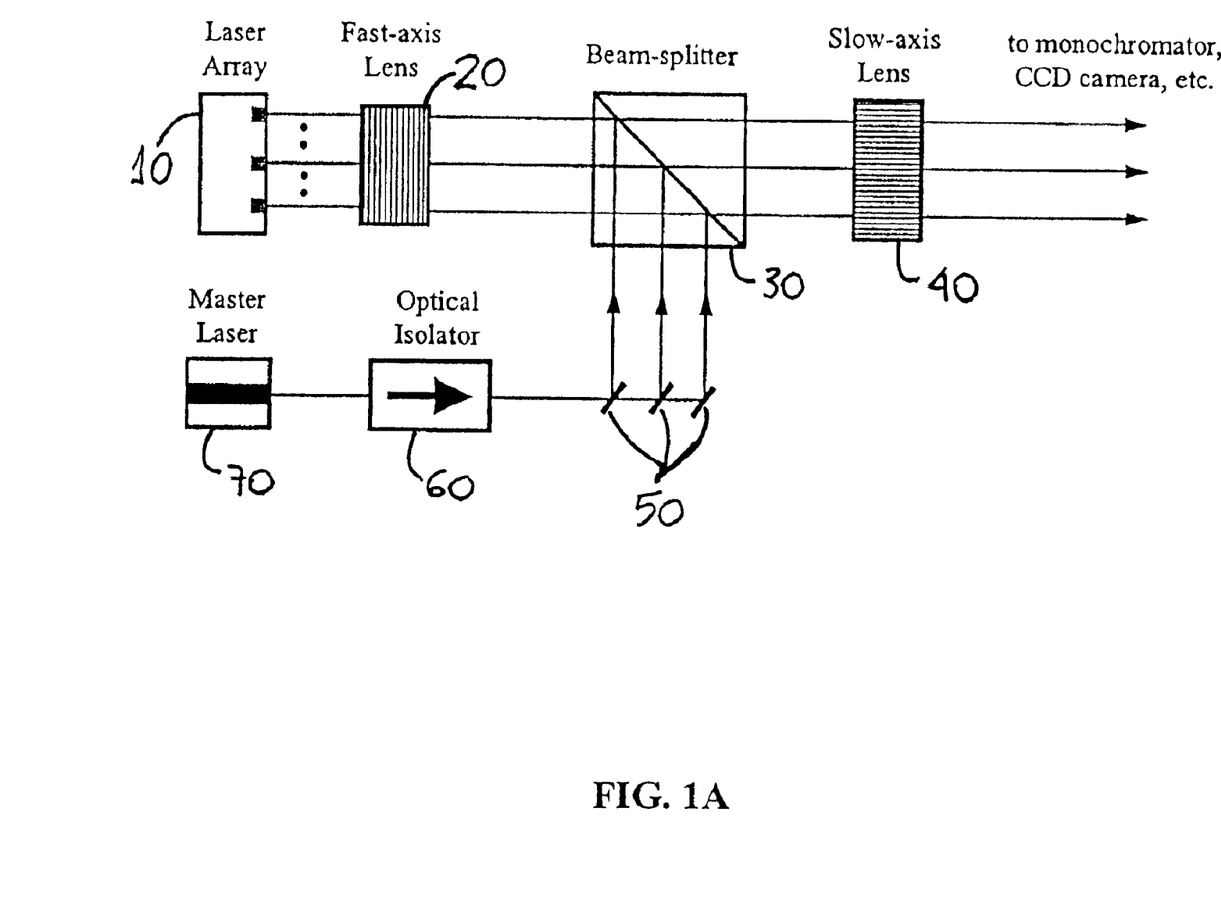
FIG. 1A illustrates a block diagram of an injection locked broad area laser diode array, representing an embodiment of the invention.

Referring to FIG. 1A, a block diagram of an implementation of the invention with an injection locked broad area laser diode array is depicted. A laser array 10 is coupled to a fast-axis lens 20. The fast axis lens 20 is coupled to a beam splitter 30. The beam splitter 30 is coupled to a set of beam splitters 50 and to a slow-axis lens 40. The set of beam splitters 50 is coupled an optical isolator 60. The optical isolator 60 is coupled to a master laser 70.

Still referring to FIG. 1A, in preferred embodiment, the laser array 10 can include nineteen broad area lasers diodes assembled in one dimension with a spacing of 500 μm between neighboring lasers. Each diode can have an emitting area that is 150 μm wide and 1 μm thick, and each diode may be capable of emitting an output power of the order of 1 W. A wavelength of each laser can be 808 nm, with a spectral width of about 1 nm. Since a far-field angle of a broad area laser diode along a fast axis (perpendicular to a laser junction plane) can be 50°, while a far-field angle along the slow-axis (parallel to the laser junction plane) can be 3°, a fast-axis lens 20 and a slow-axis lens 40 (cylindrical, each with different focal lengths) can be used to collimate an output beam of the laser array 10.

Still referring to FIG. 1A, a single-mode wavelength tunable laser diode can be used as the master laser 70. The master laser can have a linewidth of 1 MHz and an output of 30 mW. The optical isolator 60 can be used to avoid an unwanted optical feedback to the master laser 70. The optical isolator 60 can provide an isolation of 60 dB. In order to obtain an efficient light injection, the master laser 70 output beam can be split into multiple parallel beams via the set of beam splitters 50, and each parallel beam can be injected into each broad area laser of the laser array 10.

Alternatively, a computer generated hologram (CGH) can also be used to split the injection beam from the master laser 70.

Figure 1B:
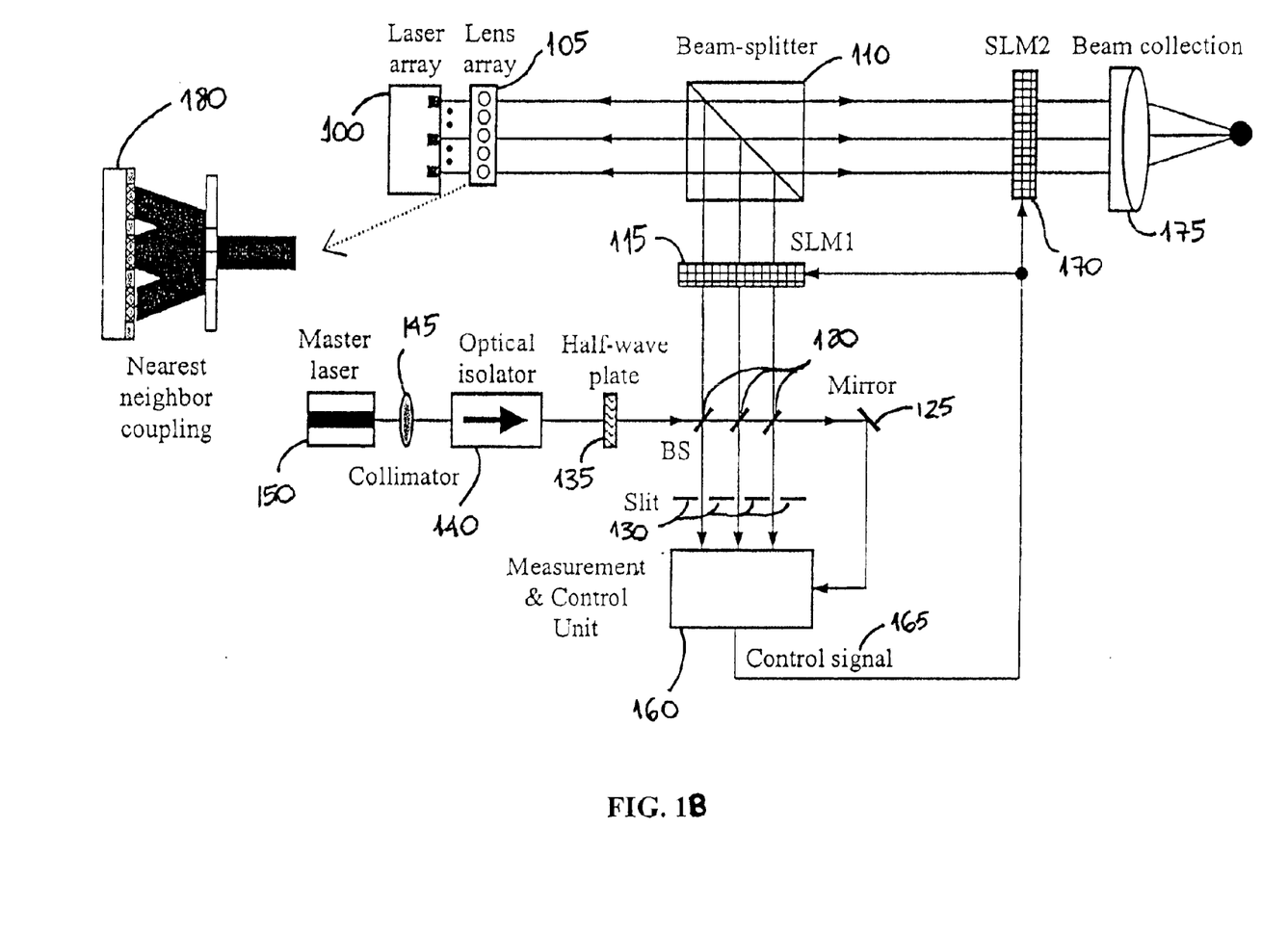
FIG. 1B illustrates a block diagram of an experimental implementation, representing an embodiment of the invention.

Referring to FIG. 1B, a block diagram of an implementation of the invention is depicted. A laser array 100 is coupled to a lens array 105. The lens array 105 is coupled to a beam splitter 110. The beam splitter 110 is coupled to a first spatial light modulator 115. The first spatial light modulator 115 is coupled to a set of beam splitters 120. The set of beam splitters 120 is coupled to a half-wave plate 135. The half-wave plate 135 is coupled to an optical isolator 140. The optical isolator 140 is coupled to a collimator 145. The collimator 145 is coupled to a single mode master laser 150. A set of slits 130 is also coupled to the set of beamsplitters 120. A mirror 125 is coupled to the set of beam splitters 120. A measurement and control unit 160 is coupled to the set slits 130 and to the mirror 125. A control signal 165 from the measurement and control unit 160 is coupled to the first spatial light modulator 115. The spatial light modulator is used as an optical phase modulator array. Such spatial light modulators are readily commercially available products; for instance the PAL-SLM Model X7550 by Hamamatsu Photonics. A second spatial light modulator 170 is coupled to the control signal 165 and to the beam splitter 110. A beam collector 175 is coupled to the second spatial light modulator 170. A nearest neighbor coupling 180 between the lens array 105 and the laser array 100 is also illustrated.

Still referring to FIG. 1B, this implementation can comprise four main parts: (i) an injection light system, including the single mode master laser 150, the collimator 145, the optical isolator 140 and the half-wave plate 135; (ii) an injection beam optics system, which can be used to divide the injection beam into multiple sub-beams, and to distribute each sub-beam into the different lasers within the laser array 100, including the set of beam splitters 120, the first spatial light modulator 115, the beam splitter 110, and the lens array 105; (iii) an external coupling system, described below in more detail and optionally including the nearest neighbor coupling 180; and (iv) a beam collection system, which can control the phase of each synchronized laser output beam based on interference between each synchronized laser output beam and a reference light from the master laser 100, including the set of slits 130, the measurement and control unit 160, the second spatial light modulator 170, and the beam collector 175.

Coupling enhances the injection efficiency to achieve synchronization of a laser array. Specifically, at high pumping levels, a well-designed coupling can improve the coherence of the array.

A global external beam coupling can also be achieved with an external spherical mirror or half-mirror. The control signal 165 generated at the measurement and control unit 160, based on interference between each synchronized laser output and a reference light taken from the master laser 150, is used to control the first spatial light modulator 115 and the second spatial light modulator 170.

Figure 2A:
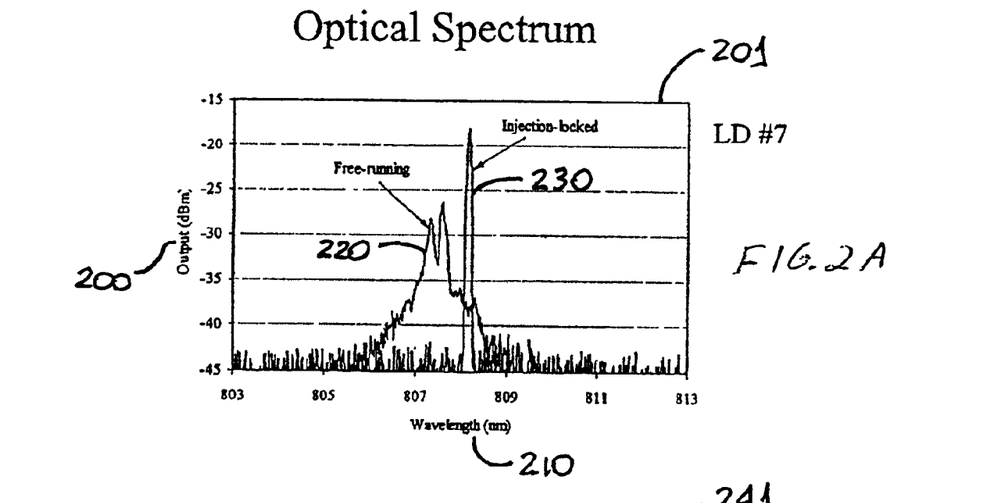
FIGS. 2A and 2B illustrate experimental results, representing an embodiment of the invention.
Figure 2B:
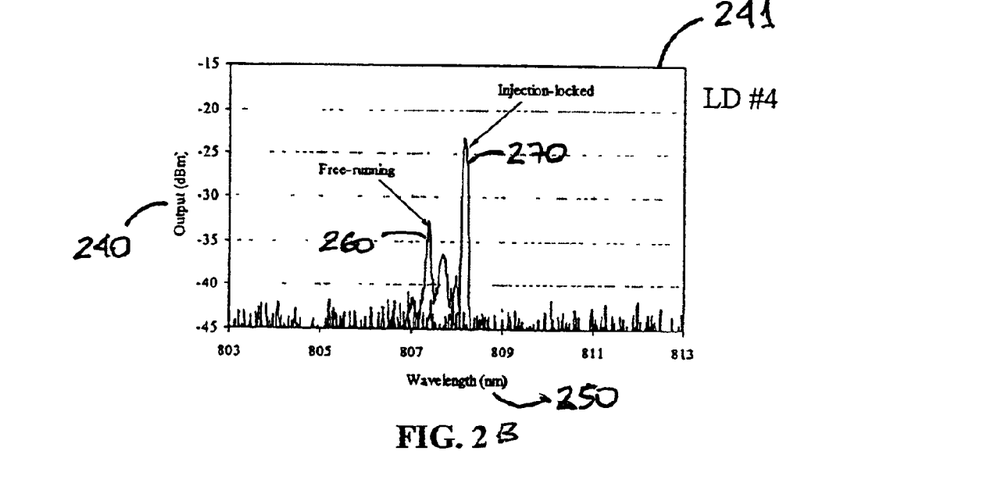

Referring to FIGS. 2A and 2B, experimental results from the implementation shown in FIG. 1B are depicted. Graphs 201, 241 illustrate simultaneous synchronization of two lasers in the broad area laser diode array. A first free running plot 220 of an output (dBm) 200 versus a wavelength (nm) 210, and an first injection locked plot 230 of the output (dBm) 200 versus the wavelength (nm) 210, are shown in graph 201 for a first laser diode. A second free running plot 260 of an output (dBm) 240 versus a wavelength (nm) 250, and a second injection locked plot 270 of the output (dBm) 240 versus the wavelength (nm) 250, are shown in graph 241 for a second laser diode.

Still referring to FIGS. 2A and 2B, the first free running plot 220 and the second free running plot 260 illustrate the output spectrum of each laser diode before synchronization. The first injection locked plot 230 and the second injection locked plot 270 illustrate the output spectrum of each laser diode after synchronization. These results can show that the pair of broad area laser diode array can be synchronized to a single master laser.

Figure 3A:
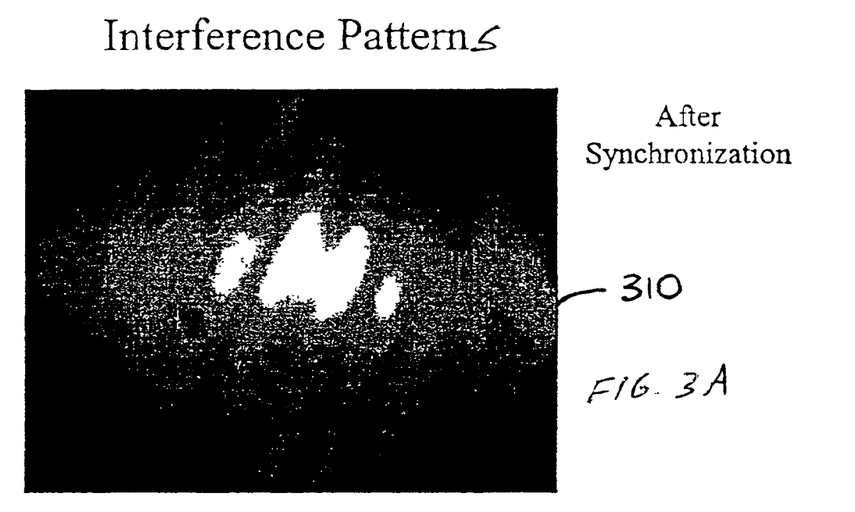
FIGS. 3A and 3B illustrate more experimental results, representing an embodiment of the invention.
Figure 3B:
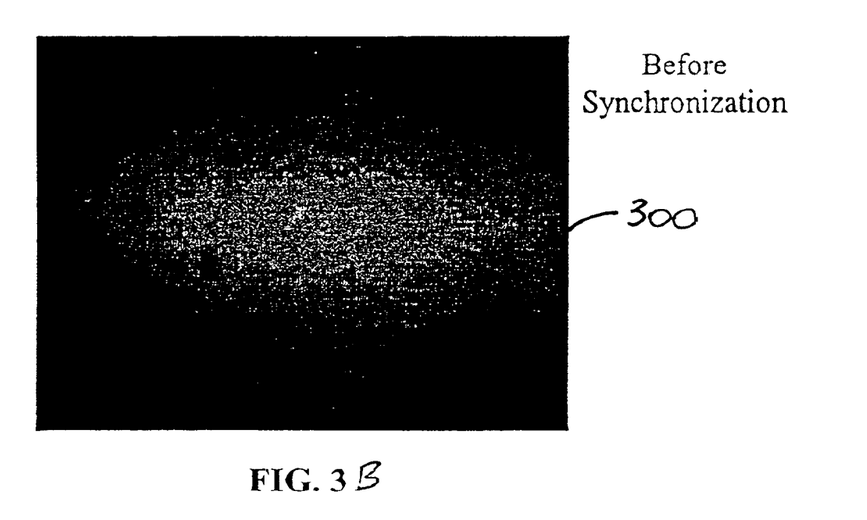

Referring to FIGS. 3A and 3B, a pair of interference patterns 300, 310 illustrates experimental results of a simultaneous synchronization of two lasers in the broad area laser diode array. The pattern 300 shows the beam interference fringe as a result of synchronization. The pattern 310 shows the overlap of two beams before synchronization. These results clearly show that the pair of broad area laser diode array can be synchronized to a single master laser. Synchronization of broad area laser diode arrays can yield not only a remarkable and unexpected coherence enhancement, but also an in-phase locking between different lasers on the array.

Figure 4A:
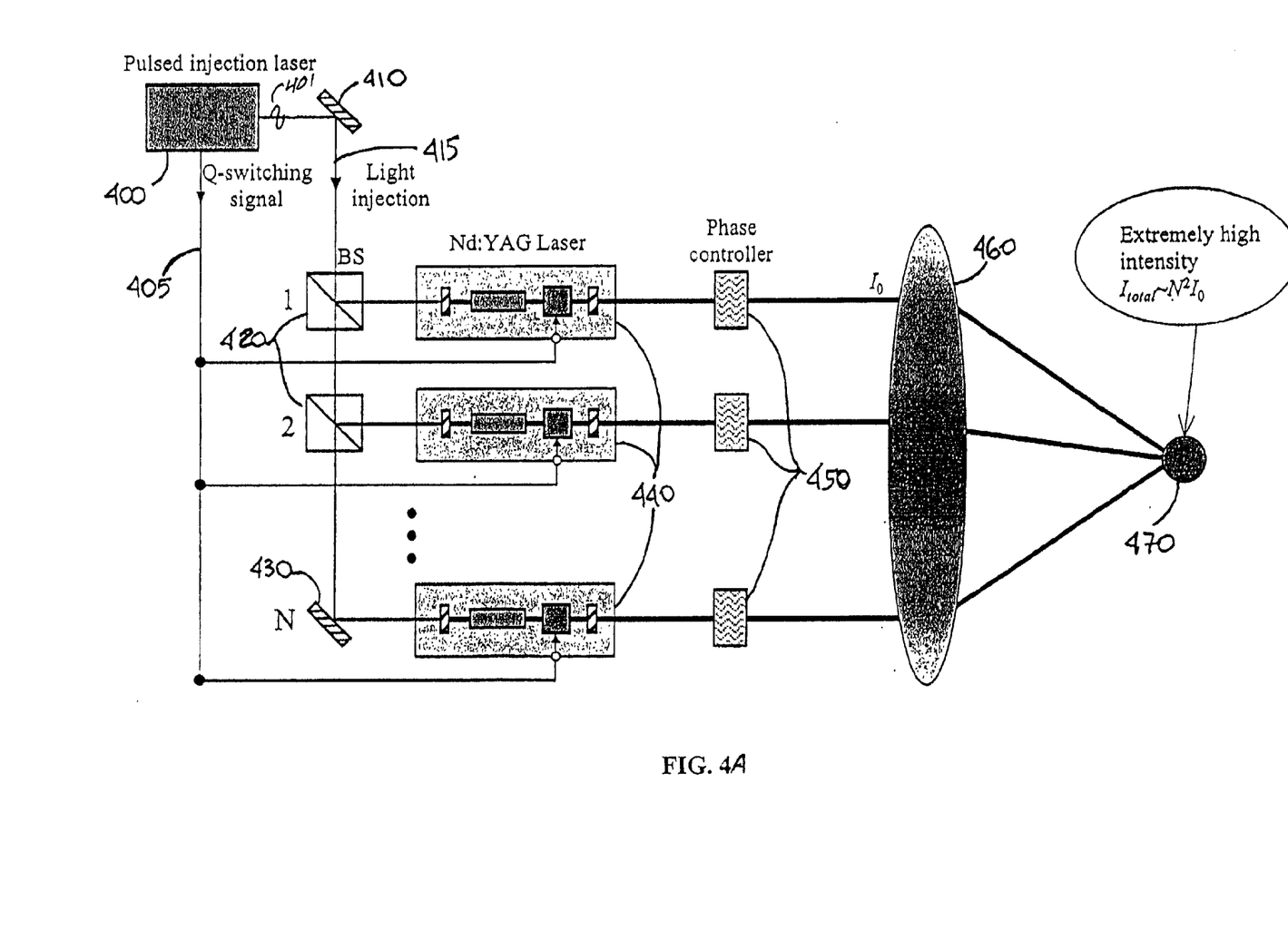
FIGS. 4A and 4B illustrate block diagrams of an experimental implementation of a pulsed Nd:YAG laser array, representing an embodiment of the invention.
Figure 4B:
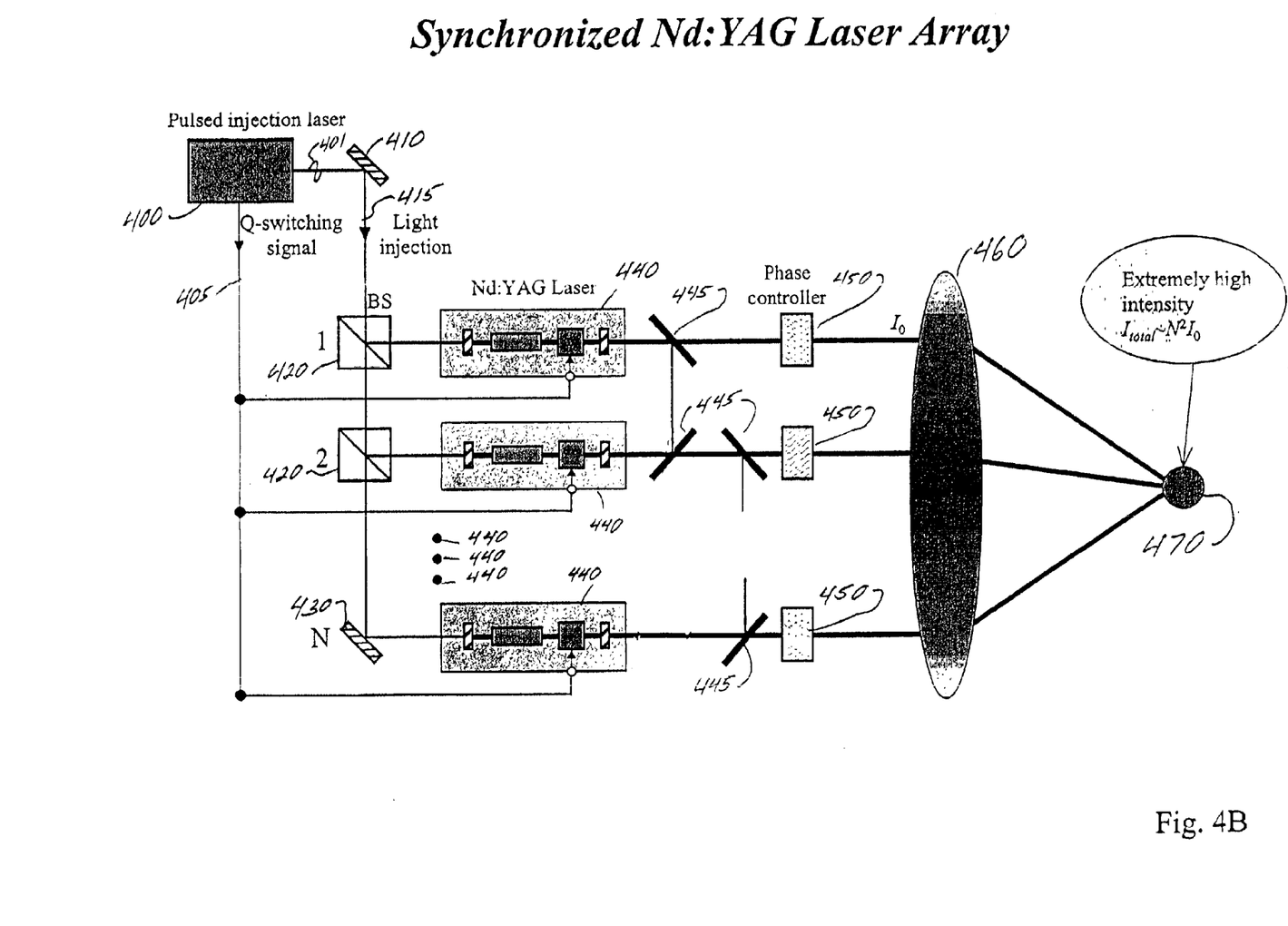

Referring to FIGS. 4A and 4B, block diagrams of a pulsed Nd:YAG laser array are depicted. Of course, the invention is not limited to these implementations. In FIG. 4A, master laser injecting, Q switch circuitry and phase synchronization are shown. External cavity coupling beamsplitters 445 are also shown in FIG. 4B. A pulsed injection laser 400 produces an optical pulse 401 and is coupled to a first reflector 410. A light injection beam 415 is coupled to the reflector 410. A set of beam splitters 420 is coupled to the light injection beam 415. A second reflector 430 is coupled to the set of beam splitters 420. Meanwhile, a Q switching signal 405 is generated based on the modulation signal of the pulsed injection laser 400. An array of Nd:YAG lasers 440 is coupled to the set of beam splitters 420, to the second 430 reflector, and to the Q-switching signal 405. A set of phase controllers 450 is coupled of the array of Nd:YAG lasers 440. A collection lens 460 is coupled to the set of phase controllers 450. A central lobe (focal point) 470 is coupled to the collection lens 460.

Still referring to FIGS. 4A and 4B, the implementation of synchronizing Nd:YAG laser array can be a scalable design which can be implemented with a varied number of lasers and/or with different types of lasers. The pulsed injection laser 400 can be a solid state Nd:YAG laser. An optical isolator (not shown in FIGS. 4A and 4B) can be placed before the pulsed injection laser 400 to prevent feedback into its cavity. A modulated injection beam can be fed into the array of Nd:YAG lasers 440. A pulsing behavior can be obtained by modulating the loss of each laser of the array of Nd:YAG lasers 440 separately. Every laser of the array of Nd:YAG lasers 440 can be coupled together by the set of beam splitters 420 and the second reflector 430 (external optical feedback). The phases from each laser of the array of Nd:YAG lasers 440 can be adjusted at the output by a set of phase controllers 450, and all beams can be collected at a central lobe (focal point) 470. The phase controllers 450 can be driven with data from slits and a measurement and control unit similar to the subsystem shown in FIG. 3. When the wavelength of each laser of the array of Nd:YAG lasers 400 as well as the phase of the pulse can be locked to the pulsed injection laser 400, coupling among laser of the array of Nd:YAG lasers 440 (after a phase correction) can result in a total intensity that is proportional to the square of N, where N is the number of lasers in the array of Nd:YAG lasers 440.

The beam splitter 445 elements in FIG. 4B can be used to realize nearest neighbor coupling between Nd:YAG lasers 440 in the array.

Figure 5:
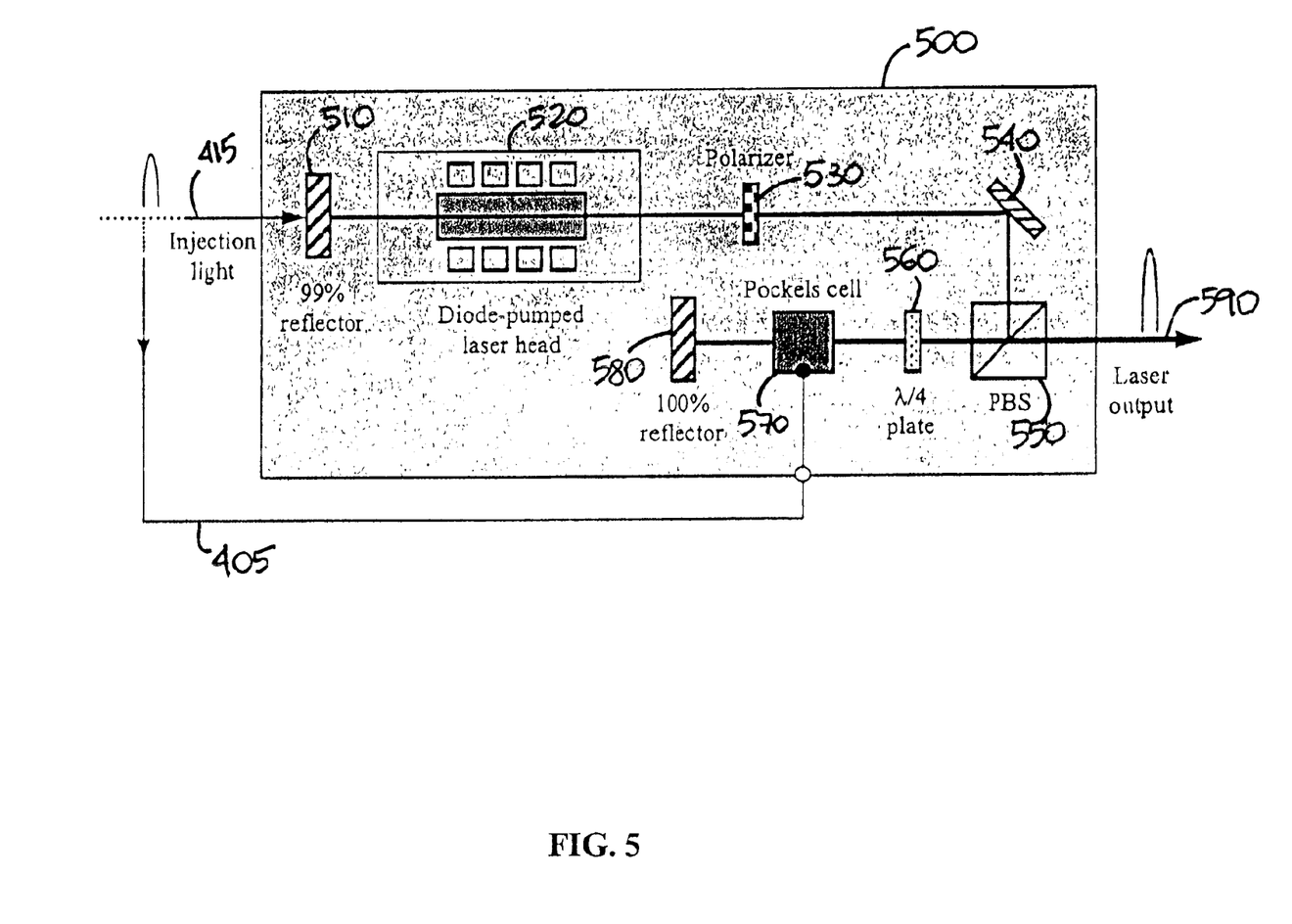
FIG. 5 illustrates a block diagram of a slave laser cavity, representing an embodiment of the invention.

Referring to FIG. 5, a block diagram of a slave laser 500 is depicted with the loss modulation shown in more detail. The light injection 415 is coupled to the slave laser 500 via a high-reflection mirror 510. The first high-reflection mirror 510 is coupled to a diode-pumped laser head 520. A polarizer 530 is coupled to the diode-pumped laser head 520. A reflector 540 is coupled to the polarizer 530. A polarized beam-splitter 550 is coupled to the reflector 540 and a quarter-wavelength plate 560. A pockels cell 570 is coupled to the quarter-wavelength plate 560. A very high-reflection mirror 580 is coupled to the pockels cell 570. The quarter-wavelength plate generates cross polarization on the return path to the polarization beam splitter 550. The Q-switching signal 405 is coupled to the Nd:YAG slave laser 500 via the pockels cell 570. A laser output 590 is coupled to the polarization beam splitter 550. The polarization beam splitter emits output 590 when there is cross polarization.

Still referring to FIG. 5, the pockels cell 570 can be used as a Q-switch device. When a voltage is applied to the pockels cell 570 via signal 405, the pockels cell 570 acts as another quarter-wavelength plate, thereby canceling the cross polarization effect of the quarter-wavelength plate 560. The pockels cell 570 timing can be synchronized with the Q-switching signal 405, so that during a high Q-condition time period, light is regeneratively amplified in the slave laser 500. Meanwhile, the diode-pumped laser head 520 is locked to the wavelength of the injection light 415. After the pockels cell 570 is switched off, an amplified pulse with the locked wavelength can be released from the slave laser via polarization beam splitter 550.

Figure 6:
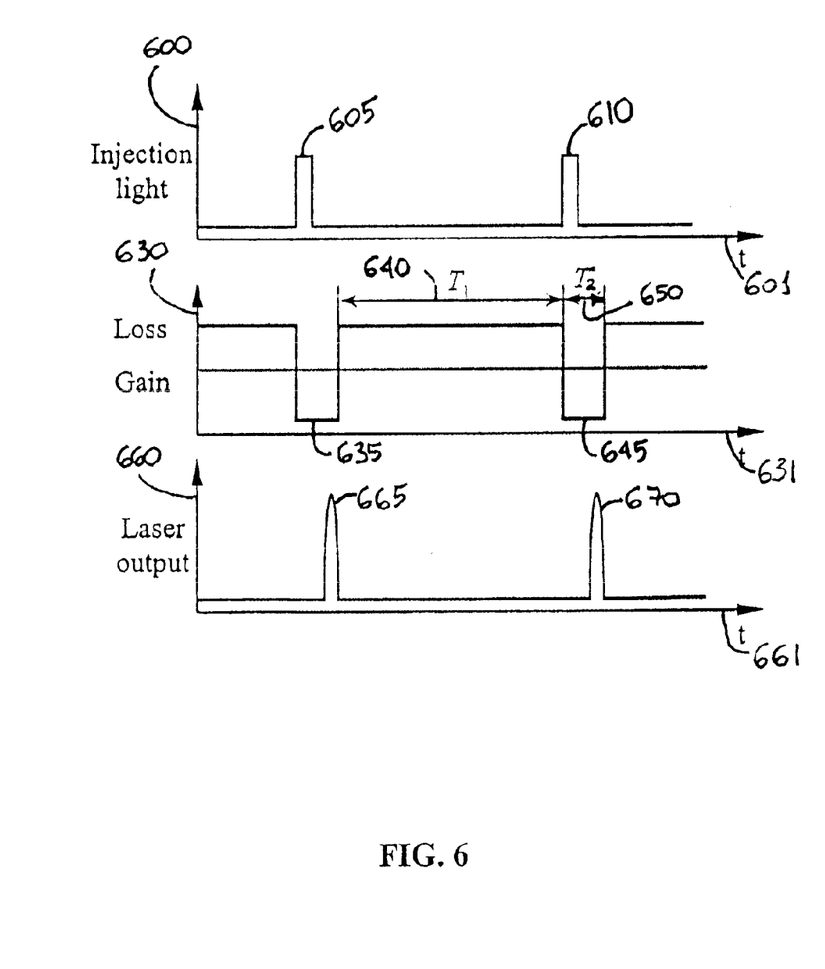
FIG. 6 illustrates a graph of an injection locking, representing an embodiment of the invention.

Referring to FIG. 6, the various events are depicted. An injection light graph is plotted over time (axis 600 and 601, respectively). A loss/gain graph is plotted over time (axis 630 and 631, respectively). And a slave laser output graph is plotted over time (axis 660 and 661, respectively). It can be appreciated that a pair of injection light pulses 605, 610 is synchronized with a pair of loss pulses 635, 645 and a pair of laser output pulses 665, 670.

Referring to FIGS. 5 and 6, during a time $T_1$ 640, there is no voltage applied to the pockels cell 570, so the pockels cell 570 is operated at a zero wave retardation. Reflected light from the very high-reflection mirror 580 is transmitted through the polarization beam splitter 550. Under these conditions, the slave laser 500 is in a low Q-condition due to a large loss.

Referring to FIGS. 4, 5 and 6, at the end of the time $T_1$ 640, the pulsed injection laser 400 sends an injection light 415 pulsed) into the slave laser cavity 500 through the first high-reflection mirror 510. At the same time, the Q-switching signal 405 applies a voltage to the pockels cell 570. The light is feedback within the slave laser cavity 500 forming a high Q-condition. Under this condition, energy can build up between the high-reflection mirror 510 and the very high-reflection mirror 580. The energy can be regeneratively amplified in the slave laser cavity 500 for a time $T_2$ 650. Finally, the Q-switching signal 405 can remove the voltage from the pockels cell 570, and an amplified pulse 670 can be sent through the polarization beam splitter 550 in a very short time interval.

Figure 7A:
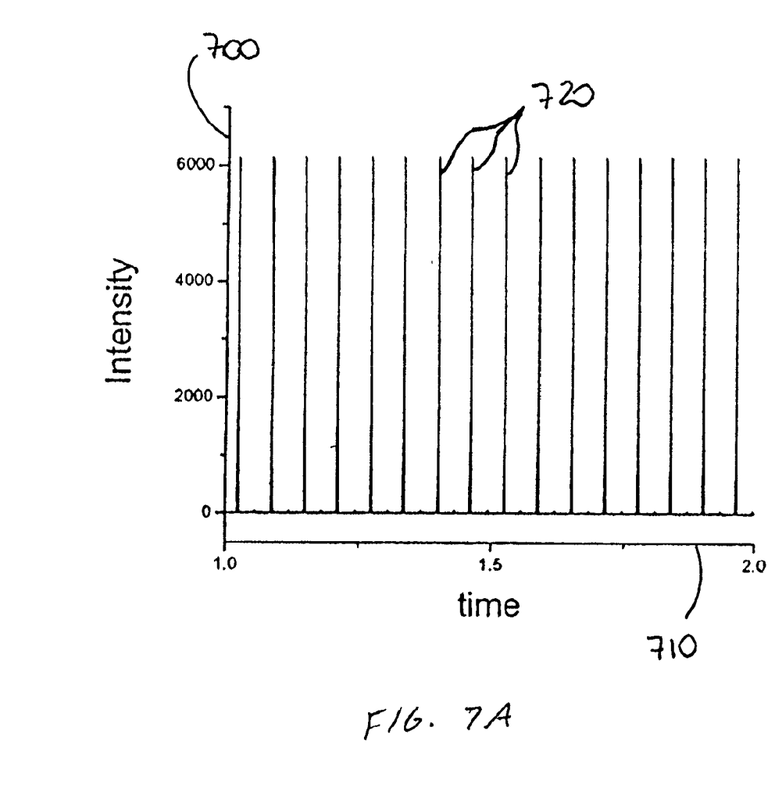
FIGS. 7A and 7B illustrate a pair of output intensity graphs, representing an embodiment of the invention.
Figure 7B:
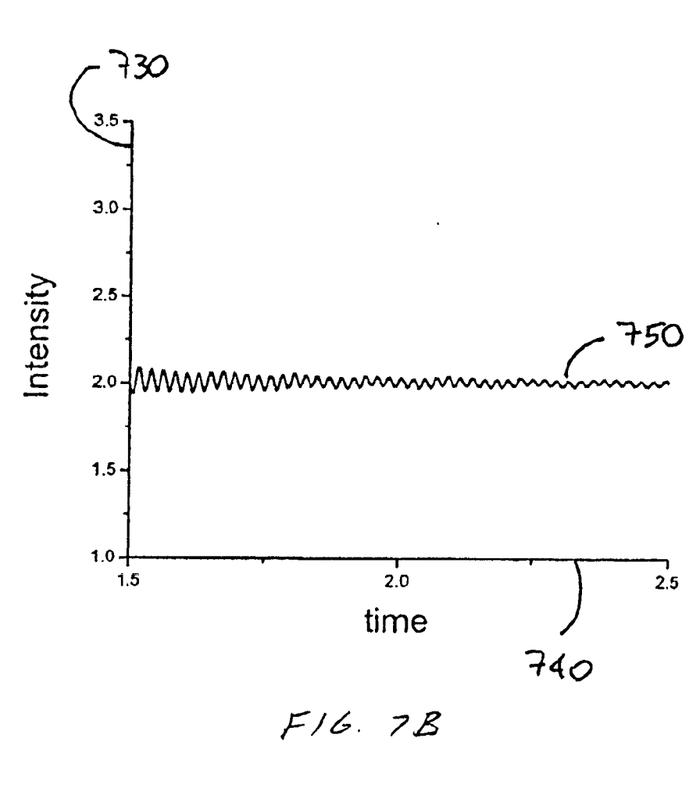

Referring to FIGS. 7A and 7B, a pair of output intensity graphs (computer simulation) is depicted. FIG. 7A shows an intensity 700 of five coupled in-phase synchronized Nd:YAG lasers operated in a pulsing mode plotted against a time 710, the output illustrated by a set of pulses 720. FIB. 7B shows intensity 730 of a single Nd:YAG laser operated at a continuous wave mode plotted against another time 740. It can be appreciated that three orders of magnitude in the peak intensity can be obtained with the Q switching.

Figure 8:
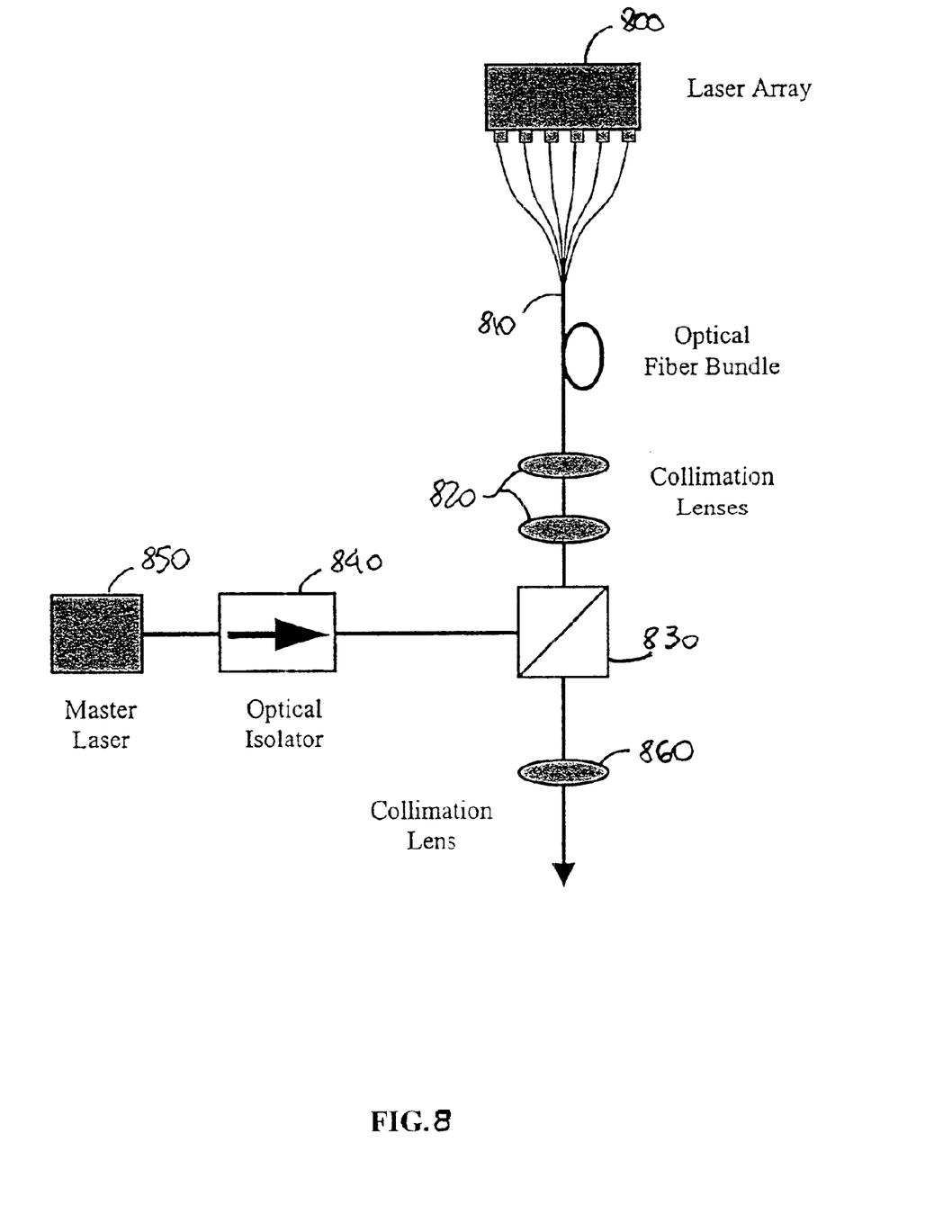
FIG. 8 illustrates a block diagram of a fiber configuration implementation, representing an embodiment of the invention.

Referring to FIG. 8, a block diagram of an optical fiber configuration implementation is depicted. A laser array 800 is coupled to an optical fiber bundle 810. The optical fiber bundle 810 is coupled to a set of collimation lenses 820. The set of collimation lenses 820 is coupled to a beam splitter 830. The beam splitter 830 is coupled to an optical isolator 840. The optical isolator 840 is coupled to the master laser 850. A collimation lens is coupled to the beam splitter 830.

The invention can also be included in a kit. The kit can include some, or all, of the components that compose the invention. The kit can be an in-the-field retrofit kit to improve existing systems that are capable of incorporating the invention. The kit can include software, firmware and/or hardware for carrying out the invention. The kit can also contain instructions for practicing the invention. Unless otherwise specified, the components, software, firmware, hardware and/or instructions of the kit can be the same as those used in the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term approximately, as used herein, is defined as at least close to a given value (e.g., preferably within 10% of, more preferably within 1% of, and most preferably within 0.1% of). The term substantially, as used herein, is defined as at least approaching a given state (e.g., preferably within 10% of, more preferably within 1% of, and most preferably within 0.1% of). The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Practical Applications of the Invention

A practical application of the invention that has value within the technological arts is synchronization of broad area laser arrays. Further, the invention is useful in conjunction with semiconductor single mode lasers, semiconductor broad area lasers, solid state lasers, fiber lasers, $CO_2$ lasers, or the like. Applications involving laser arrays synchronized via injection locking, external cavity coupling and optionally internal coupling can include: optical communications, metrology, material processing, and several others wherein high intensity and high coherence may be required. There are virtually innumerable uses for the invention, all of which need not be detailed here.

Advantages of the Invention

A laser array synchronization, representing an embodiment of the invention, can be cost effective and advantageous for at least the following reasons. The invention provides a flexible, compact and scalable laser configuration which can reduce the weight and power requirements for laser operations. The total output intensity emitted from an optically injected and in phase synchronized coupled array of N lasers can be proportional to $N^2$. A high power density (of the order of $MW/cm^2$) can be achieved by coupling output beams from different broad area laser diodes locked by the same injection frequency. Injection locking of multiple broad area lasers or pulsed Nd:YAG lasers can provide an enhancement in the total output intensity of a laser array. The invention improves quality and/or reduces costs compared to previous approaches.

All the disclosed embodiments of the invention disclosed herein can be made and used without undue experimentation in light of the disclosure. The invention is not limited by theoretical statements recited herein. Although the best mode of carrying out the invention contemplated by the inventors is disclosed, practice of the invention is not limited thereto. Accordingly, it will be appreciated by those skilled in the art that the invention may be practiced otherwise than as specifically described herein.

Further, the individual components need not be formed in the disclosed shapes, or combined in the disclosed configurations, but could be provided in virtually any shapes, and/or combined in virtually any configuration. Further, the individual components need not be fabricated from the disclosed materials, but could be fabricated from virtually any suitable materials.

Further, although the laser array synchronization described herein can be a separate module, it will be manifest that the laser array synchronization may be integrated into the system with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

References

[1] Narrow Bandwidth Operation of High-Power Broad-Area Diode Laser Using Cascaded Phase-Conjugate Injection Locking, Applied Physics B, Vol. 68, 1021–1025, (H. Horiuchi et al. eds.), 1999.

[2] Phase Locking of a Linear Array of High-Power Laser Diodes, Quantum Electronics, Vol. 29, 839–841, (V. V. Apollonov et al. eds.), 1999.

[3] Power-Scalable System of Phase-Locked Single-Mode Diode Lasers, Applied Optics, Vol. 38, 5752–5760, (L. Bartelt-Berger et al. eds.), 1999.

What is claimed is:

1. A method, comprising:
   master laser injection synchronizing a plurality of broad area lasers by modulating the plurality of broad area lasers using a master laser; and
   externally cavity coupling the plurality of broad area lasers,
   wherein modulating includes individually controlling a phase of each of a plurality of injection beams
   wherein controlling includes generating a control signal based on interference between i) each synchronized laser output from each of the plurality of broad area lasers and ii) a reference light taken from the master laser, and
   wherein externally cavity coupling includes using a beam collection system that controls each synchronized laser output from each of the plurality of broad area lasers based on interference between I) each synchronized laser output from each of the plurality of broad area lasers and II) the reference light from the master laser.

2. The method of claim 1, wherein master laser injecting includes master laser injecting in a pulse mode.

3. The method of claim 1, wherein master laser injecting includes master laser injecting in a continuous mode.

4. The method of claim 1, wherein external cavity coupling includes external cavity coupling using a plurality of beam splitters.

5. The method of claim 1, wherein external cavity coupling includes global coupling the plurality of broad area lasers.

6. The method of claim 1, wherein external cavity coupling includes nearest neighbor coupling of the plurality of broad area lasers.

7. The method of claim 1, further comprising Q switch coupling the plurality of broad area lasers.

8. The method of claim 7, wherein Q switch coupling includes modulating with a signal source that is also used to control master laser injecting.

9. The method of claim 1, further comprising evanescent coupling the plurality of broad area lasers.

10. The method of claim 1, wherein the plurality of board area lasers define an array and an output intensity of the array is directly proportional to a square of a number of broad area lasers that are included in the array.

11. The method of claim 1, wherein synchronizing includes individually controlled mode-matching.

12. A method, comprising:
   master laser injection synchronizing a plurality of broad area lasers by modulating the plurality of broad area lasers using a Q switching pulse master laser; and
   externally Q switch coupling the plurality of broad area lasers,
   wherein externally Q switch coupling includes generation of a Q switching signal based on a modulation signal of the Q switching pulse master laser and distributing the Q switching signal to the plurality of broad area lasers to synchronize switching timing,
   wherein modulating includes individually controlling a phase of each of a plurality of injection beams,
   wherein controlling includes generating a control signal based on interference between i) each synchronized laser output from each of the plurality of broad area lasers and ii) a reference light taken from the Q switching pulse master laser, and
   wherein externally Q switch coupling includes using a beam collection system that controls each synchronized laser output from each of the plurality of broad area lasers based on interference between I) each synchronized laser output from each of the plurality of broad area lasers and II) the reference light from the Q switching pulse master laser.

13. The method of claim 12, further comprising external cavity coupling the plurality of broad area lasers.

14. The method of claim 13, wherein external cavity coupling includes global coupling the plurality of broad area lasers.

15. The method of claim 13, wherein external cavity coupling includes nearest neighbor coupling of the plurality of broad area lasers.

16. The method of claim 13, wherein external cavity coupling includes external cavity coupling using a plurality of beam splitters.

17. The method of claim 12, further comprising evanescent coupling the plurality of broad area lasers.

18. The method of claim 12, wherein the plurality of broad area lasers define an array and an output intensity of the array is directly proportional to a square of a number of broad area lasers that are included in the array.

19. The method of claim 12, wherein synchronizing includes individually controlled mode-matching.

20. An apparatus, comprising:
a plurality of broad area lasers;
a master injection synchronizing laser coupled to each of the plurality of broad area lasers, wherein the master injection synchronizing laser modulates the plurality of broad area lasers; and
external cavity coupling optics coupled to each of the plurality of broad area lasers,
wherein the modulation of the plurality of broad area lasers by the master injection synchronizing laser includes individually controlling a phase of each of a plurality of injection beams,
wherein controlling includes generating a control signal based on interference between i) each synchronized laser output from each of the plurality of broad area lasers and ii) a reference light taken from the master laser, and
wherein the external cavity coupling optics include a beam collection system that controls each synchronized laser output from each of the plurality of broad area lasers based on interference between I) each synchronized laser output from each of the plurality of broad area lasers and II) the reference light from the master injection synchronizing laser.

21. The apparatus of claim 20, further comprising Q switch circuitry coupled to each of the broad area lasers.

22. The apparatus of claim 20, wherein the beam collection system includes:
a beam splitter coupled to the plurality of broad area lasers;
a first spatial light modulator coupled to the beam splitter;
a second spatial light modulator coupled to the beam splitter;
a set of beam splitters coupled to the first phase spatial light modulator;
a set of slits coupled to the set of beam splitters;
a mirror coupled to the set of beam splitters;
a measurement and control unit coupled to the set of slits, the mirror, the first spatial light modulator and the second spatial light modulator,
wherein the master injection laser is coupled to the set of beam splitters.

23. The apparatus of claim 20, further comprising nearest neighbor optical coupling between at least two of the plurality of broad area lasers.

24. An apparatus, comprising:
a plurality of broad area lasers;
a master injection synchronizing laser coupled to each of the plurality of broad area lasers, wherein the master injection synchronizing laser modulates the plurality of broad area lasers; and
a Q switch circuit externally coupled to each of the plurality of broad area lasers wherein the o switch circuit externally Q switch couples the plurality of broad area lasers by generating a Q switching signal based on a modulation signal from the master injection synchronizing laser and distributes the Q switching signal to the plurality of broad area lasers to synchronize switching timing,
wherein the modulation of the plurality of broad area lasers by the master injection synchronizing laser includes individually controlling a phase of each of a plurality of injection beams,
wherein controlling includes generating a control signal based on interference between i) each synchronized laser output from each of the plurality of broad area lasers and ii) a reference light taken from the master injection synchronizing laser, and
wherein the external cavity coupling optics include a beam collection system that controls of each synchronized laser output from each of the plurality of broad area lasers based on interference between I) each synchronized laser output from each of the plurality of broad area lasers and II) the reference light from the master injection synchronizing laser.

25. The apparatus of claim 24, wherein each of the plurality of broad area lasers includes a Q switched broad area laser including a pockels cell coupled to the Q switch circuit and a polarization beam splitter coupled to the pockels cell.

26. The apparatus of claim 24, further comprising external cavity coupling optics coupled to each of the plurality of broad area lasers.

27. The apparatus of claim 24, wherein the beam collection system includes:
a beam splitter coupled to the plurality of broad area lasers;
a first spatial light modulator coupled to the beam splitter;
a second spatial light modulator coupled to the beam splitter;
a set of beam splitters coupled to the first phase spatial light modulator;
a set of slits coupled to the set of beam splitters;
a mirror coupled to the set of beam splitters;
a measurement and control unit coupled to the set of slits, the mirror, the first spatial light modulator and the second spatial light modulator,
wherein the master injection laser is coupled to the set of beam splitters.

28. The apparatus of claim 24, further comprising nearest neighbor optical coupling between at least two of the plurality of broad area lasers.

29. A method, comprising:
master laser injection synchronizing a plurality of broad lasers by modulating the plurality of broad area lasers using a master laser; and
externally coupling the plurality of broad area lasers using at least one member selected from the group consisting of external cavity coupling and external Q switch coupling,
wherein modulating includes individually controlling an amplitude of each of a plurality of injection beams,
wherein controlling includes generating a control signal based on interference between i) each synchronized laser output from each of the plurality of broad area lasers and ii) a reference light taken from the master laser, and wherein externally coupling includes using a beam collection system that controls each synchronized laser output from each of the plurality of broad area lasers based on interference between l) each synchronized laser output from each of the plurality of broad area lasers and ll) the reference light from the master laser.

30. The method of claim 29, wherein external cavity coupling includes nearest neighbor coupling between at least two of the plurality of broad area lasers.

31. The method of claim 30, wherein the nearest neighbor coupling includes evanescent coupling.

32. The method of claim 29, wherein the plurality of broad area lasers define an array and an output intensity of the array is directly proportional to a square of a number of broad area lasers that are included in the array.

33. The method of claim 29, wherein synchronizing includes individually controlled mode-matching.

34. An apparatus, comprising:
   a plurality of broad lasers;
   a master injection synchronizing laser coupled to each of the plurality of broad area lasers, wherein the master injection synchronizing laser modulates the plurality of broad area laser
   external coupling optics coupled to each of the plurality of broad area lasers, the external coupling optics including at least one member selected from the group consisting of external cavity coupling optics and external Q switch coupling optics,
   wherein the modulation of the plurality of broad area lasers by the master injection synchronizing laser includes individually controlling an amplitude of each of a plurality of injection beams,
   wherein controlling includes generating a control signal based on interference between i) each synchronized laser output from each of the plurality of broad area lasers and ii) a reference light taken from the master laser, and
   wherein the external coupling optics include a beam collection system that controls each synchronized laser output from each of the plurality of broad area lasers based on interference between l) each synchronized laser output from each of the plurality of broad area lasers and ll) the reference light from the master injection synchronizing laser.

35. The apparatus of claim 34, wherein each of the plurality of broad area lasers includes a Q switched broad area laser including a pockels cell coupled to a Q switch and a polarization beam splitter coupled to the pockels cell.

36. The apparatus of claim 34, wherein the beam collection system includes;
   a beam splitter coupled to each of the plurality of broad area lasers;
   a first spatial light modulator coupled to the beam splitter;
   a second spatial light modulator coupled to the beam splitter;
   a set of beam splitters coupled to the first phase spatial light modulator;
   a set of slits coupled to the set of beam splitters;
   a mirror coupled to the set of beam splitters;
   a measurement and control unit coupled to the set of slits, the mirror, the first spatial light modulator and the second spatial light modulator,
   wherein the master injection laser is coupled to the set of beam splitters.

* * * * *